(12) United States Patent
Numakura et al.

(10) Patent No.: US 9,824,861 B2
(45) Date of Patent: Nov. 21, 2017

(54) SUBSTRATE PROCESSING APPARATUS, SUBSTRATE PROCESSING METHOD AND RECORDING MEDIUM RECORDING SUBSTRATE PROCESSING PROGRAM

(71) Applicant: Tokyo Electron Limited, Tokyo (JP)

(72) Inventors: Masahiro Numakura, Miyagi (JP); Yoshikazu Ishikawa, Miyagi (JP); Toshihiko Hamada, Miyagi (JP); Junya Sato, Miyagi (JP); Toshiyuki Kobayashi, Miyagi (JP); Shouichi Otake, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 6 days.

(21) Appl. No.: 14/970,714

(22) Filed: Dec. 16, 2015

(65) Prior Publication Data
US 2016/0190024 A1 Jun. 30, 2016

(30) Foreign Application Priority Data
Dec. 25, 2014 (JP) ................ 2014-262860

(51) Int. Cl.
| | | |
|---|---|---|
| G01R 31/26 | (2014.01) | |
| H01L 21/66 | (2006.01) | |
| H01J 37/32 | (2006.01) | |
| H01L 21/677 | (2006.01) | |
| H01L 21/67 | (2006.01) | |

(52) U.S. Cl.
CPC .. H01J 37/32009 (2013.01); H01L 21/67259 (2013.01); H01L 21/67276 (2013.01); *H01L 21/67253* (2013.01); *H01L 21/67742* (2013.01)

(58) Field of Classification Search
CPC ......... H01L 21/67276; H01L 21/67742; H01L 21/67745; H01L 21/67253
See application file for complete search history.

(56) References Cited

U.S. PATENT DOCUMENTS

2007/0292598 A1* 12/2007 Tada ................ C23C 16/46
427/8
2008/0167744 A1* 7/2008 Sakano ............ H01L 21/67173
700/108

FOREIGN PATENT DOCUMENTS

| JP | 2002-043394 | 2/2002 |
|---|---|---|
| JP | 2013-258260 | 12/2013 |

* cited by examiner

*Primary Examiner* — Zandra Smith
*Assistant Examiner* — John M Parker
(74) *Attorney, Agent, or Firm* — IPUSA, PLLC

(57) ABSTRACT

A substrate processing apparatus includes at least one process module configured to process first substrates. A position detector is configured to detect first positions of the first substrates. A control unit is configured to control the position detector so as to measure a second position of a second substrate selected from the first substrates to be processed in a same process module depending on a measurement interval set for the same process module.

3 Claims, 10 Drawing Sheets

| TOTAL COUNTER | | MEASUREMENT INTERVAL | INTEGRATED VALUE |
|---|---|---|---|
| | | 100 | 2708 |

| INDIVIDUAL COUNTER | PROCESS RECIPE NAME | MEASUREMENT INTERVAL | INTEGRATED VALUE |
|---|---|---|---|
| INDIVIDUAL COUNTER 1 | | ------- | ------- |
| INDIVIDUAL COUNTER 2 | | ------- | ------- |
| INDIVIDUAL COUNTER 3 | | ------- | ------- |
| INDIVIDUAL COUNTER 4 | | ------- | ------- |
| INDIVIDUAL COUNTER 5 | | ------- | ------- |
| INDIVIDUAL COUNTER 6 | | ------- | ------- |
| INDIVIDUAL COUNTER 7 | | ------- | ------- |
| INDIVIDUAL COUNTER 8 | | ------- | ------- |

| TOTAL COUNTER | | MEASUREMENT INTERVAL | INTEGRATED VALUE |
|---|---|---|---|
| | | INVALID | ------- |

| INDIVIDUAL COUNTER | PROCESS RECIPE NAME | MEASUREMENT INTERVAL | INTEGRATED VALUE |
|---|---|---|---|
| INDIVIDUAL COUNTER 1 | RecipeClass/Recipe1 | 20 | 304 |
| INDIVIDUAL COUNTER 2 | RecipeClass/Recipe2 | 40 | 1001 |
| INDIVIDUAL COUNTER 3 | Recipe3 | 100 | 280 |
| INDIVIDUAL COUNTER 4 | Recipe4 | 50 | 4 |
| INDIVIDUAL COUNTER 5 | | ------- | ------- |
| INDIVIDUAL COUNTER 6 | | ------- | ------- |
| INDIVIDUAL COUNTER 7 | | ------- | ------- |
| INDIVIDUAL COUNTER 8 | | ------- | ------- |

FIG.3C

| TOTAL COUNTER | MEASUREMENT INTERVAL | INTEGRATED VALUE |
|---|---|---|
| | 100 | 2708 |

| INDIVIDUAL COUNTER | PROCESS RECIPE NAME | MEASUREMENT INTERVAL | INTEGRATED VALUE |
|---|---|---|---|
| INDIVIDUAL COUNTER 1 | RecipeClass/Recipe1 | 20 | 304 |
| INDIVIDUAL COUNTER 2 | RecipeClass/Recipe2 | 40 | 1001 |
| INDIVIDUAL COUNTER 3 | Recipe3 | 100 | 280 |
| INDIVIDUAL COUNTER 4 | Recipe4 | 50 | 4 |
| INDIVIDUAL COUNTER 5 | | ------- | ------- |
| INDIVIDUAL COUNTER 6 | | ------- | ------- |
| INDIVIDUAL COUNTER 7 | | ------- | ------- |
| INDIVIDUAL COUNTER 8 | | ------- | ------- |

FIG.3D

| TOTAL COUNTER | MEASUREMENT INTERVAL | INTEGRATED VALUE |
|---|---|---|
| | 100 | 2708 |

| INDIVIDUAL COUNTER | PROCESS RECIPE NAME | MEASUREMENT INTERVAL | INTEGRATED VALUE |
|---|---|---|---|
| INDIVIDUAL COUNTER 1 | RecipeClass/Recipe1 | INVALID | ------- |
| INDIVIDUAL COUNTER 2 | RecipeClass/Recipe2 | 40 | 1001 |
| INDIVIDUAL COUNTER 3 | Recipe3 | 100 | 280 |
| INDIVIDUAL COUNTER 4 | Recipe4 | INVALID | ------- |
| INDIVIDUAL COUNTER 5 | Recipe5 | INVALID | ------- |
| INDIVIDUAL COUNTER 6 | Recipe6 | INVALID | ------- |
| INDIVIDUAL COUNTER 7 | Recipe7 | INVALID | ------- |
| INDIVIDUAL COUNTER 8 | | ------- | ------- |

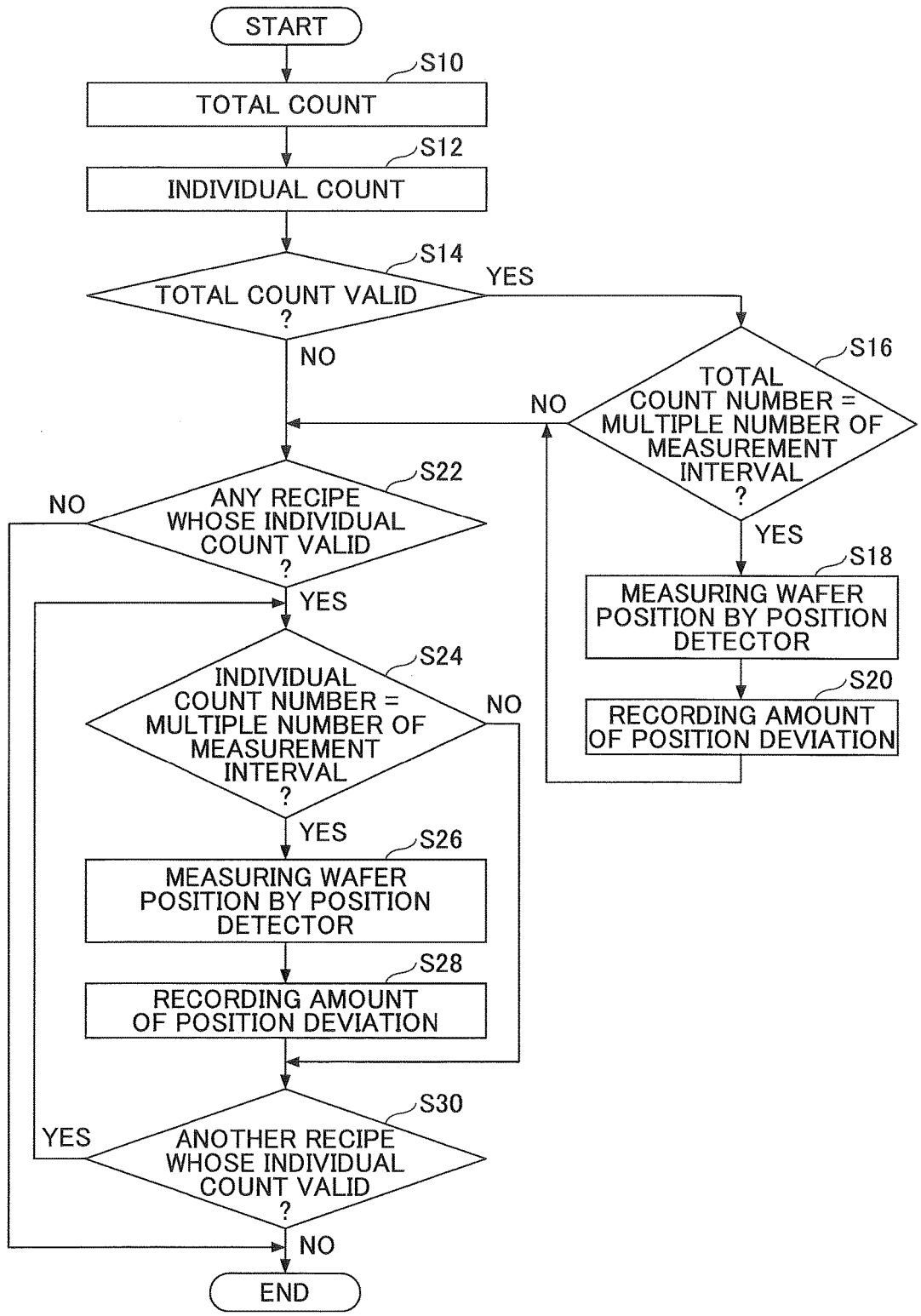

SUBSTRATE PROCESSING APPARATUS, SUBSTRATE PROCESSING METHOD AND RECORDING MEDIUM RECORDING SUBSTRATE PROCESSING PROGRAM

CROSS-REFERENCE TO RELATED APPLICATIONS

This patent application is based upon and claims the benefit of priority of Japanese Patent Application No. 2014-262860, filed on Dec. 25, 2014, the entire contents of which are incorporated herein by reference.

BACKGROUND OF THE INVENTION

1. Field of the Invention

The present invention relates to a substrate processing apparatus, a substrate processing method and a recording medium recording a substrate processing program.

2. Description of the Related Art

A position of a semiconductor wafer (which is just referred to as a "wafer" hereinafter) is sometimes out of alignment due to temporal change of a component part in a substrate processing apparatus such as an electrostatic chuck and the like. To solve this, as disclosed in Japanese Laid-Open Patent Application Publication No. 2002-43394 and Japanese Laid-Open Patent Application Publication No. 2013-258260, a position detector capable of detecting presence or absence and an amount of the position deviation is proposed. The position detector measures a position of a wafer before carrying the wafer into a process module and after carrying the wafer out of the process module, and detects an amount of a position deviation. The position detector transfers the wafer to the next module while correcting the position of the wafer based on the detected amount of the position deviation.

However, when all wafers go through the position detector in carrying the wafers into/out of the process module and the measurement of the position and correction of the position deviation are performed for all of the wafers, even wafers to be subject to a process that hardly causes the position deviation go through the position detector, thereby decreasing throughput.

SUMMARY OF THE INVENTION

Accordingly, in response to the above discussed problems, embodiments of the present invention aim to provide a substrate processing method and a substrate processing apparatus and a recording medium recording a substrate processing program that suppresses a wafer from transferring to a position detector and improves throughput.

According to one embodiment of the present invention, there is provided a substrate processing apparatus that includes at least one process module configured to process first substrates. A position detector is configured to detect first positions of the first substrates. A control unit is configured to control the position detector so as to measure a second position of a second substrate selected from the first substrates to be processed in a same process module depending on a measurement interval set for the same process module.

According to another embodiment of the present invention, there is provided a substrate processing method used for a substrate processing apparatus. The substrate processing apparatus includes at least one process module configured to process substrates, a position detector configured to detect positions of the substrate, and a control unit. In the method, the position detector is controlled by the control unit so as to measure a position of a substrate selected from the substrates to be processed in a same process module depending on a measurement interval set for the same process module.

According to another embodiment of the present invention, there is provided a non-transitory computer-readable recording medium recording a substrate processing program. The program, when executed by a computer causes the computer, by using a substrate processing apparatus including at least one process module configured to process substrates, a position detector configured to detect positions of the substrate and a control unit, to perform a substrate processing method. In the method, the position detector is controlled by the control unit so as to measure a position of a substrate selected from the substrates to be processed in a same process module depending on a measurement interval set for the same process module.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 3A though 3D are diagrams illustrating examples of a setting screen of position detection according to embodiments of the present invention;

FIG. 4 is a flowchart illustrating an example of a position detection process according to an embodiment of the present invention;

DETAILED DESCRIPTION OF THE PREFERRED EMBODIMENTS

Figure 1:
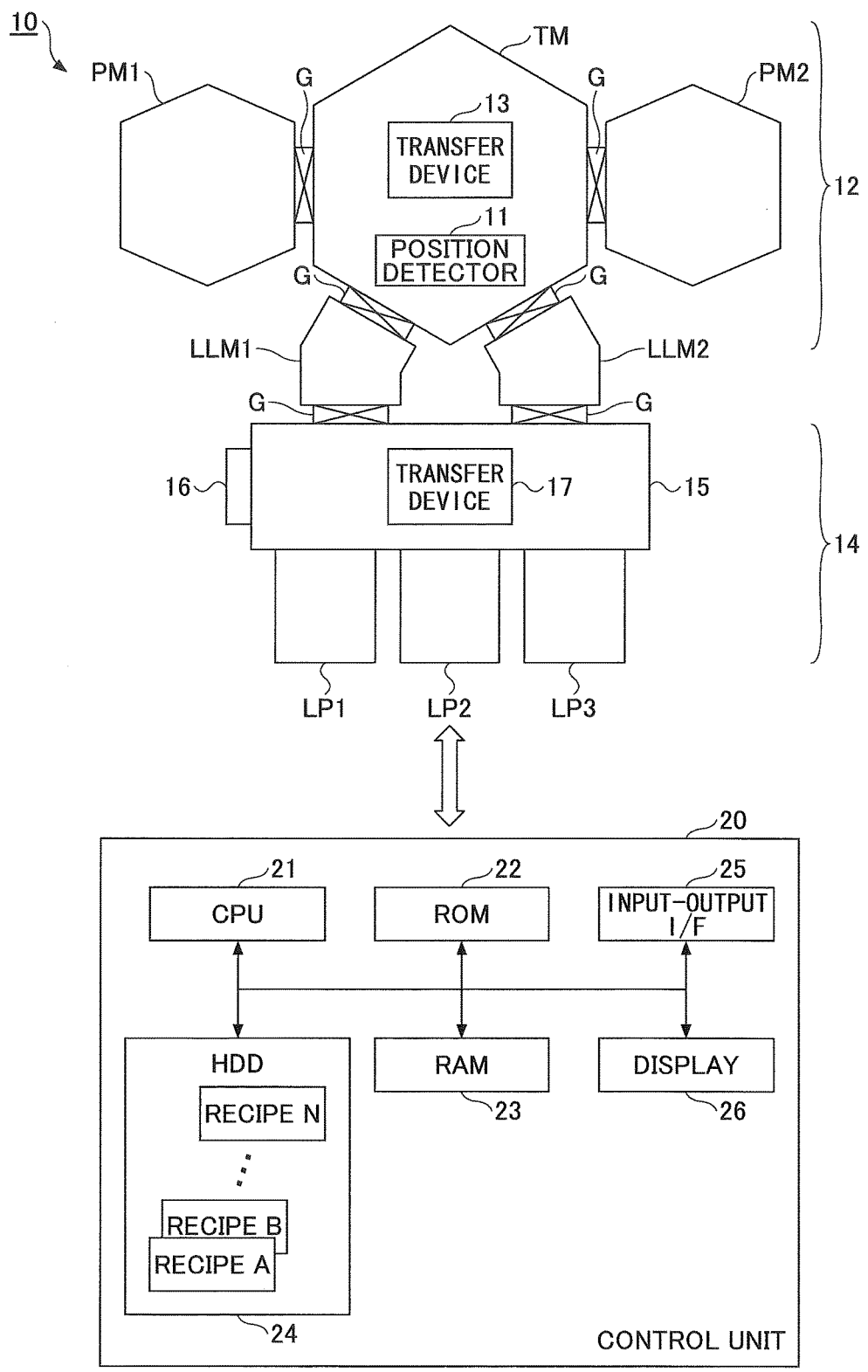
FIG. 1 is a diagram illustrating an example of an overall configuration of a substrate processing apparatus according to an embodiment of the present invention.

A description is given below of embodiments of the present invention, with reference to accompanying drawings. Note that elements having substantially the same functions or features may be given the same reference numerals and overlapping descriptions thereof may be omitted.

[Overall Configuration of Substrate Processing Apparatus]

To begin with, a description is given below of a substrate processing apparatus 10 according to an embodiment of the present invention with reference to FIG. 1. FIG. 1 illustrates an example of an overall configuration of the substrate processing apparatus of the embodiment. The substrate processing apparatus 10 includes a processing unit 12 for processing a wafer, a carry-in/out unit 14 for carrying a wafer into the processing unit 12 and carrying the wafer out of the processing unit 12, and a control unit 20 for controlling the substrate processing apparatus 10. The substrate processing apparatus of the embodiment is a cluster-tool-type (multi-chamber-type) substrate processing apparatus. However, the substrate processing apparatus is not limited to the cluster tool type.

The processing unit 12 includes process modules 1 and 2 for performing a predetermined process on a wafer. The process module may be hereinafter referred to as a "PM". Each of the PM1 and PM2 includes a chamber configured to be able to reduce a pressure therein to a predetermined degree of vacuum. In the chamber, a process such as a film deposition process and an etching process is performed on the wafer. Each of the PM1 and PM2 is connected to a transfer module through a gate valve G. The transfer module is hereinafter referred to as a "TM".

A transfer device 17 that transfers a wafer by using a robot arm is disposed in the TM. The transfer device 17 transfers the wafer between the PM1, the PM2, a load lock module 1 and a load lock module 2. The load lock module is hereinafter referred to as a "LLM."

The TM includes a position detector 11 for detecting a position of a wafer therein. Due to a temporal change of a component part in the substrate processing apparatus 10 such as an electrostatic chuck, the position of the wafer is sometimes out of alignment in the PM. Therefore, the substrate processing apparatus 10, at predetermined time intervals, selects a wafer to be caused to go through the position detector 11 before being carried into the PM1 and PM2 and after being carried out of the PM1 and PM2. The position detector 11 measures an amount of position deviation of the selected wafer, corrects the position deviation of the wafer, and then transfers the wafer to the next PM or LLM.

In the embodiment, the control unit 20 counts the number of processes performed on wafers in the same PM, selects the wafers at preset predetermined measurement intervals (more specifically, every number of processes corresponding to multiple numbers of the measurement intervals), and causes the position detector 11 to measure the position of the wafers.

The carry-in/out unit 14 includes a carry-in/out chamber 15. A pressure in the carry-in/out chamber 15 is adjusted to approximately atmospheric pressure. The carry-in/out chamber 15 includes load ports 1-3 to which FOUPs (Front Opening Unified Pod) are installed. The load port is hereinafter referred to as a "LP." A FOUP containing wafers therein or an empty FOUP is installed in each of the LP1, LP2 and LP3. Furthermore, the carry-in/out chamber 15 includes a pre-aligner 16 to align a direction of the wafer.

A transfer device 17 for transferring the wafer by using a robot arm is disposed in the carry-in/out chamber 15. The transfer device 17 transfers the wafer between LP1-LP3, the pre-aligner 16, and the LLM1 and LLM2.

Two of the LLM1 and LLM2 are provided between the processing unit 12 and the carry-in/out unit 14. Each of the LLM1 and LLM2 can switch a pressure therein between a predetermined degree of vacuum and the atmospheric pressure or the approximately atmospheric pressure. Each of the LLM1 and LLM2 is connected to the TM and the carry-in/out chamber 15 through the gate valves G. Here, the numbers of the PMs, the LLMs and the LPs are not limited to the numbers specified in the embodiment.

The control unit 20 includes a CPU (Central Processing Unit) 21, a memory area such as a ROM (Read Only Memory) 22, a RAM (Random Access Memory) 23 and an HDD (Hard Disk Drive) 24, an input-output interface (I/F) 25, and a display 26. Here, the control unit 20 may include another memory area such as an SSD (Solid State Drive), and is not limited to the HDD 24.

The CPU 21 controls a process of the wafer in each of the PMs in accordance with a recipe setting process procedures and process conditions. A memory area storing the recipe may be any of the ROM 22, the RAM 23 and the HDD 24. The HDD 24 or the RAM 23 may store a program for performing a position detecting process and a determination process in detecting the position that are described later. These recipes and programs may be provided from an external device through a network. A function of the control unit 20 may be implemented by operation using software or hardware.

The input-output interface (I/F) 25 functions as an interface for obtaining input-output information from an operation using a command performed by an operator to manage the substrate processing apparatus 10. The display 26 displays an operational status by visualizing the operational status and a setting screen of the position detection conditions to allow the operator to set the position detection conditions.

Figure 2:
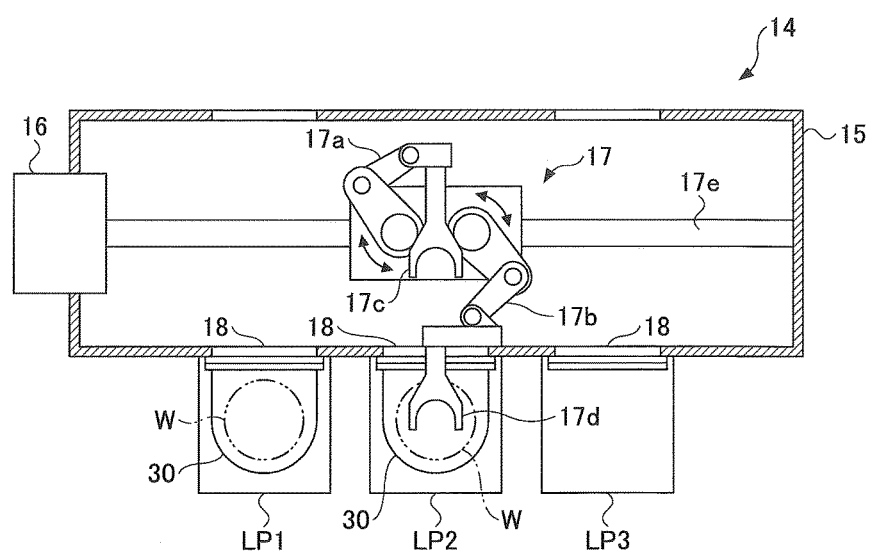
FIG. 2 is a diagram illustrating a carry-in/out part of a substrate processing apparatus according to an embodiment of the present invention.

FIG. 2 illustrates an enlarged carry-in/out unit 14 of the substrate processing apparatus of FIG. 1. A shutter 18 is provided at each of the LP1 through LP3. When a FOUP 30 containing wafers W or an empty FOUP 30 is installed in any of the LP1 through LP3, the shutter 18 is opened. This allows the inside of the FOUP 30 to be in communication with the inside of the carry-in/out chamber 15 while preventing the external air from entering the inside thereof.

The transfer device 17 is a multi-joint arm robot having two arms movable along a lengthwise direction. A lower pick 17c for picking up a wafer W is attached to a head of a multi-joint arm 17a, and an upper pick 17d is attached to a head of a multi-joint arm 17b. These picks 17c and 17d move forward and backward by causing the multi-joint arms 17a and 17b circle. Moreover, the picks 17c and 17d move up and down by causing the multi-joint arms 17a and 17b move up and down. Thus, by causing the picks 17c and 17d to move forward and backward, and up and down, the transfer device 17 can transfer the wafer between the LP1-LP3, the pre-aligner 16, and the LLM1 and LLM 2.

[Position Detecting Method]

Next, a description is given below of a position detecting method of a wafer according to an embodiment of the present invention. To begin with, a description is given below of a set-up of position detection conditions with reference to FIG. 3, and then a description is given below of a position detection process according to the embodiment with reference to FIG. 4.

(Set-Up of Position Detection Conditions)

An operator sets position detection conditions from a setting screen displayed on the display 26. FIGS. 3A through 3D illustrate examples of setting screens of the position detection conditions according to the embodiment. FIG. 3A illustrates an example in which only position detection conditions of a total counter is set in the setting screen displayed on the display 26. The total counter has a function of counting the number of processes (the number of processed wafers) performed on wafers in the same PM regardless of types of recipes and storing the counted number in the RAM 23 and the like as an integrated value. In the substrate processing apparatus 10, a total counter of the PM1 and a total counter of the PM2 may be provided, respectively. In this case, each of the total counters separately counts the number of processes performed on the wafers in each of the PM1 and PM2.

The operator sets a measurement interval as one of the position detection conditions. The control unit 20 may select a wafer to cause the position detector 11 to measure the position thereof based on the integrated value indicating the number of processes performed on wafers in the same PM after turning on the substrate processing apparatus 10 and the set measurement interval of the PM. The control unit 20 can inherit the integrated value previously counted before turning off the power after turning on the power by storing the integrated value indicating the number of processes performed on the wafers in the same PM before turning off the substrate processing apparatus 10 in a memory medium such as SRAM (Static Random Access Memory). In this case, the control unit 20 can select a wafer to cause the position detector 11 to measure the position thereof by adding the number of processes performed on the wafers in the same PM after turning on the power again to the inherited integrated value and based on the summed integrated value and the set measurement interval of the PM.

The position detector 11 measures a position of the selected wafer among the wafers to be processed in the same PM.

For example, in the case of the screen illustrated in FIG. 3A, the control unit 20 causes wafers at the time when the integrated value reaches a multiple number of 100 in response to the set measurement intervals of "100" to go through the position detector 11. The position detector 11 detects a position deviation of the selected wafers each time the integrated value becomes the multiple number of 100. The position detector 11 corrects the position of the wafer so that the wafer is placed on the center of an electrostatic chuck in the PM to be carried in next, and then transfer the wafer to the next process module.

FIG. 3B illustrates an example in which the total counter is invalid and the position detection conditions of the individual counters are set in the setting screen displayed on the display 26. In the individual counters, process recipe names and measurement intervals are settable. The operator sets the process recipe names and the measurement intervals as part of the position detection conditions. When the wafers are subject to difference processes in accordance with a plurality of types of recipes in the same PM, a process is performed that causes a great temporal change of a component part such as the electrostatic chuck disposed in the substrate processing apparatus 10 depending on the recipe. For example, in a recipe supplying great high frequency power to a pedestal on which a wafer is placed, the temperature of the wafer rises. This causes the wafer to expand due to the heat, thereby sometimes having an impact on the temporal change of the electrostatic chuck on the pedestal. Thus, the process causing a great temporal change of the component part and a process hardly causing a temporal change of the component part are present depending on types of recipe. Hence, for the wafers to which the recipe for the process causing the great temporal change is applied, the position detection conditions are preferably set such that the position detection is performed at predetermined measurement intervals. On the other hand, for the wafers to which the recipe for the process hardly causing the temporal change is applied, the individual counter of the recipe may be set to be invalid. This allows the position detection of the wafers processed in accordance with the recipe for the process causing a small temporal change or hardly causing the temporal change of the component part not to be performed.

As discussed above, in the embodiment, the position detection conditions relating to the recipe for the process causing the great temporal change of the component part can be individually specified. As examples of the recipe for the process causing the great temporal change of the component part, in addition to the temporal change of the electrostatic chuck, a recipe generating an abrasion likely to cause the position deviation of the wafer due to a temporal change of a component part in a chamber such as a focus ring, and a recipe causing a reaction product to adhere on a component part in the chamber, can be cited.

In the case of the individual counter, the number of processes performed on wafers in accordance with recipes having the same name is counted among the wafers processed in the same PM, and the counted number is stored in the RAM 23 and the like as an integrated value.

The control unit 20 selects wafers going through the position detector 11 depending on how many times wafers have been processed in accordance with a set predetermined recipe among wafers to be processed in the same PM after turning on the power of the substrate processing apparatus 10. For example, in the case of an "individual counter 1" illustrated in a screen of FIG. 3B, a measurement interval corresponding to a process recipe name of "RecipeClass/Recipe1" is "20." The control unit 20 selects wafers at the time when an integrated value of the individual counter 1 becomes a multiple number of 20, and causes the transfer device 17 to transfer the wafers to the position detector 11.

Similarly, a measurement interval of an individual counter 2 corresponding to a process recipe name of "RecipeClass/Recipe2" is "40." The control unit 20 selects wafers at the time when an integrated value of the individual counter 2 becomes a multiple number of 40 depending on a measurement interval set in the individual counter 2, and causes the transfer device 17 to transfer the wafers to the position detector 11.

Thus, two types of counters of the total counter and the individual counter are used differently. For example, the same process is repeated in the same PM in a mass production process flow. In this case, the total counter is preferably used. In contrast, when different processes in a variety of process flows are performed in the same PM, the individual counter is preferably used. Moreover, when the mass production process flow and the variety of process flows are mixed with each other, using the total counter and the individual counter together is preferable.

FIG. 3C illustrates an example in which position detection conditions of a total counter and position detection conditions of an individual counter are set to use the total counter and the individual counter together. FIG. 4D illustrates an example of another screen in which position detection conditions of a total counter and position detection conditions of an individual counter are set. As illustrated in FIGS. 3C and 3D, an operator can individually set a setting of a measurement interval of the total counter (i.e., measurement interval of the PM) and a setting of a measurement interval of the individual counter (i.e., predetermined measurement interval of the recipe) at valid or invalid. The control unit 20 selects wafers whose position is to be measured depending on the valid measurement interval of the total counter and the invalid measurement interval of the individual counter.

The detection position conditions can be set and changed any time without respect to the timing. Specifying the recipe name, inputting the measurement interval, and setting each counter at valid or invalid are possible even while the substrate processing apparatus 10 is operating or idling. Here, the set or changed position detection conditions are applied to the conditions stored since a wafer is carried out of a FOUP and until the wafer is carried out of the LLM. The change and the like performed after the wafer is carried out of the LLM is applied to the next and subsequent wafers. Thus, the selection of the wafer is performed in accordance with the position detection conditions stored before the wafer is carried out of the LLM, and the detection and correction of the position deviation are performed by the position detector 11 for the selected wafer.

Here, the position detector 11 may automatically set the position detection conditions. In this case, the control unit 20 accumulates the position detection conditions settings set by the operator and detection results of the amount of position deviation measured by the position detector 11 by associating the position detection conditions settings with the detection results of the amount of position deviation. The control unit 20 accumulates data of a correlation between the amount of position deviation and the measurement interval for the wafers processed in each PM. The control unit 20 may accumulate data of a correlation between the amount of position deviation and the measurement interval for the wafers processed in the same PM every recipe. The position detector 11 can automatically set or change the position detection conditions based on the accumulated data of the correlation.

(Position Detection Process)

A description is given below of an example of a position detection process according to an embodiment of the present invention with reference to FIG. 4. The position detection process of the embodiment can be controlled by the control unit 20. Thus, the wafer subject to the position detection is selected by the control unit 20 by way of the position detector 11.

To begin with, the control unit 20 counts the number of processes performed on wafers in the same PM (total count: step S10). Next, the control unit 20 counts the number of processes performed on the wafer for each set recipe among the wafers processed in the same PM (individual count: step S12).

Subsequently, the control unit 20 determines whether the setting condition of the total count is "valid" (step S14). When determining that the setting condition is "valid", the control unit 20 determines whether the total count number (integrated value) is a multiple number of the set measurement interval (step S16). When determining that the total count number (integrated value) is the multiple number of the set measurement interval, the control unit 20 selects the wafer as a wafer whose position deviation is to be detected. Thus, the position detector 11 detects positions of the wafer before being carried in a PM and after being carried out of the same PM for the selected wafer, and measures an amount of position deviation of the wafer (step S18). Next, the control unit 20 records the amount of position deviation of the wafer in the HDD 24 and the like (step S20), and the process goes to step S22.

On the other hand, in step S14, when the control unit 20 determines that the position detection condition of the total count is set at "invalid", the process directly goes to step S22. Meanwhile, in step S16, when the control unit 20 determines that the total count number (integrated value) is not the multiple number of the set measurement interval, the process advances to step S22. Thus, the wafer can be selected without going through the position detector 11, and throughput can be improved by not performing the position detection excessively.

Next, the control unit 20 determines whether there is a recipe whose setting condition of the individual count is set at valid. When determining that the recipe whose setting condition of the individual count is set at "valid" is not present, the control unit 20 finishes the present process flow.

On the other hand, when determining that the recipe whose setting condition of the individual count is set at "valid" is present, the control unit 20 determines whether the individual count number (integrated value) is a multiple number of the set measurement interval (step S24). When determining that the individual count number (integrated value) is the multiple number of the set measurement interval, the control unit 20 selects the wafer as a wafer whose position deviation is to be detected. Thus, the position detector 11 detects a position of the wafer before being carried into the PM and a position of the wafer after being carried out of the same PM for the selected wafer, and measures an amount of position deviation of the wafer (step S26). Next, the control unit 20 records the amount of position deviation of the wafer in the HDD 24 and the like (step S28), and the process goes to step S30.

In step S24, when the control unit 20 determines that the individual count number (integrated value) is not the multiple number of the set measurement interval, the process goes to step S30.

In step S30, the control unit 20 determines whether there is another recipe whose setting condition of the individual count is set at "valid." When determining that another recipe whose setting condition of the individual count is set at "valid" is not present, the control unit 20 finishes the present process flow. When determining that another recipe whose setting condition of the individual count is set at "valid" is present, by returning to step S24, the control unit 20 repeats the processes of steps S24 through S30. The processes of steps S24 through S30 are repeated until another recipe whose setting condition of the individual count is set at "valid" is not present.

Here, in the present process flow, when the total count number is the multiple number of the measurement interval ("YES" at step S16), and the individual count number is the multiple number of the measurement interval ("YES" at step S24), the processes of measuring the position (steps S18 and S26) and recording the position deviation (steps S20 and S28) are performed by the position detector 11 twice for the same wafer. Accordingly, the processes of steps S26 and S28 may be omitted for the wafer subject to the processes of steps S18 and S20.

According to the substrate processing apparatus 10 of the embodiment and the position detection process of the embodiment implemented by the substrate processing apparatus 10, when a total counter or an individual counter becomes a multiple number of a measurement interval, a position of a wafer is measured before carrying the wafer into a PM and after carrying the wafer out of the PM, and a position deviation in the PM can be detected from a difference of the positions of the wafer before and after carrying the wafer into/out of the PM. In this manner, by measuring the position deviation of the wafer when carrying the wafer into/out of the PM, a change of the position deviation in the PM can be traced. This enables a temporal change of the component part in the PM to be estimated.

Moreover, according to the position detection process of the embodiment, wafers are selected by sampling the wafers at regular intervals from all of the wafers to be processed depending on the set measurement intervals. The selected wafers are transferred to the position detector 11, and the positions thereof are measured. This prevents the wafers from being excessively transferred to the position detector 11, thereby improving the throughput.

Figure 5:
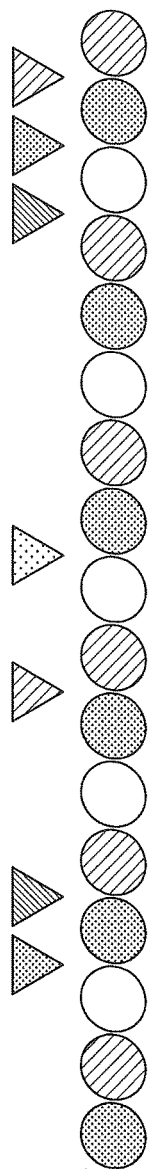
FIG. 5 is a diagram for explaining position detection timing according to an embodiment of the present invention.

For example, as illustrated in FIG. 5, it is assumed that the set measurement intervals are set at "five times" for a total counter, "two times" for an individual counter 1, and "three times" for an individual counter 2. In this case, wafers corresponding to multiple numbers of the measurement intervals of the total counter are selected based on an integrated value of the total counter, like the fifth wafer, the tenth wafer, the fifteenth wafer, . . . among the wafers to be processed, based on an integrated value of the total counter, and then transferred to the position detector 11, where the position detection of the wafers and the correction of the position are performed.

Furthermore, wafers corresponding to multiple numbers of the measurement intervals of the individual counter 1 are selected based on an integrated value of the individual counter 1, like the second wafer, the fourth wafer, the sixth wafer, among the wafers to be processed in accordance with a recipe specified in the individual counter 1, and then transferred to the position detector 11, where the position detection of the wafers and the correction of the position are performed.

Similarly, wafers corresponding to multiple numbers of the measurement intervals of the individual counter 2 are selected based on an integrated value of the individual counter 2, like the third wafer, the sixth wafer, . . . among the wafers to be processed in accordance with a recipe specified in the individual counter 2, and then transferred to the position detector 11, where the position detection of the wafers and the correction of the position are performed. As a result, the transfer of the wafers to the position detector 11 can be suppressed, thereby improving the throughput.

Figure 6:
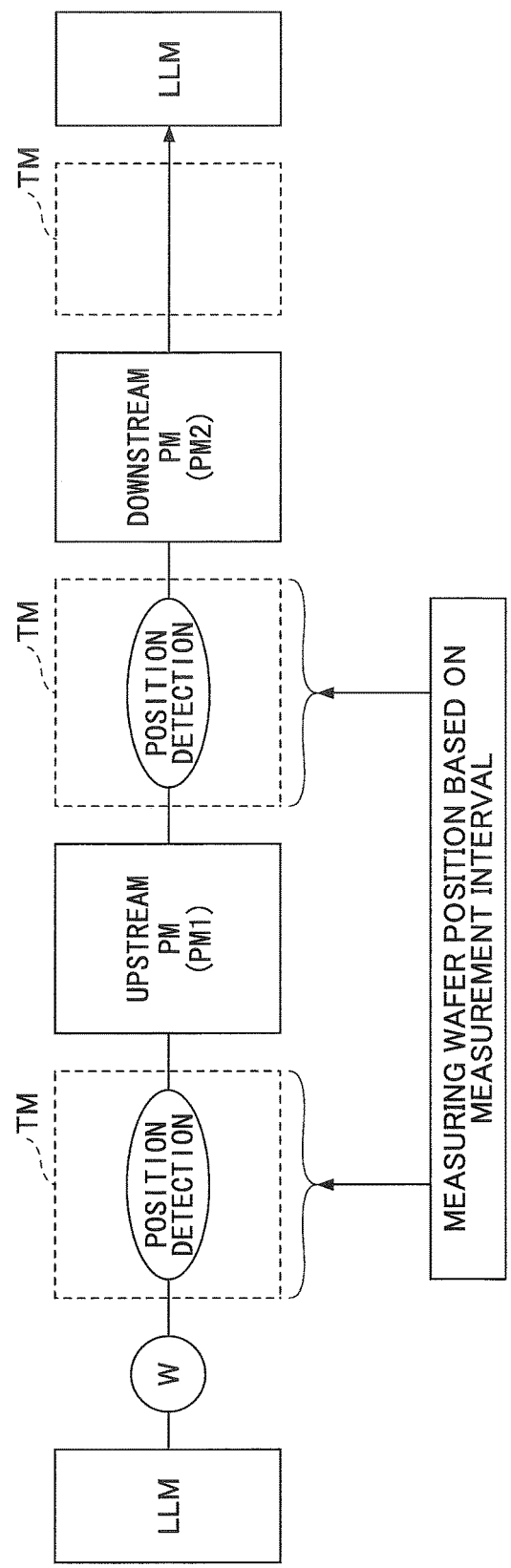
FIG. 6 is a diagram for explaining measurement timing for a plurality of process modules according to an embodiment of the present invention.

In addition, as illustrated in FIG. 6, when a wafer W (expressed as "W" in FIG. 6) carried out of the LLM is transferred to the PM1 that is an upstream PM and the PM 2 that is a downstream PM in this order; the total counter of the PM1 is set at valid; the total counter of the PM2 is set at invalid; and all of the individual counters are set at invalid, an inspection of the position deviation of the wafers is not performed at the PM2. The inspection of the position deviation is performed before carrying the wafer into the PM1 and after carrying the wafer out of the PM1 for the selected wafer at regular intervals based on set measurement intervals at the PM1. As a result, the transfer of the wafers to be processed in the PM2 to the position detector 11 can be reduced, thereby improving the throughput.

[Modifications]

Next, a description is given below of a determination process when detecting a position according to a modification of the above embodiment with reference to FIGS. 7 and 8.

As an example of a factor of the position deviation of a wafer in the PM, the position deviation is presumed to be generated when the wafer is stripped from an electrostatic chuck. When the wafer cannot be smoothly detached in stripping the wafer, the wafer bounces and the position of the wafer is out of alignment. Moreover, when the bounce of the wafer becomes high, a risk of casing a crack and a breakage to the wafer is increased.

Accordingly, in the determination process during the position detection of the present modification, an amount of a position deviation of a wafer in carrying the wafer into/out of the PM is checked at each PM, and a predetermined process is performed when the position deviation in carrying the wafer into/out of each PM is beyond a permissible range of each PM. Giving notice to an operator or stopping the transfer device 13 by an interlock are cited as examples of the predetermined process. This makes it possible to promptly respond to an abnormality of the substrate processing apparatus 10.

For example, the determination process when detecting the position of the wafer according to the modification is preferably performed at transfer timings of (1)-(3) of FIG. 7 as follows:

(1) When a wafer is transferred from the LLM1 or LLM2 to the PM1 or PM2 by way of the TM;

(2) When a wafer is transferred from the PM1 to the PM2 by way of the TM (or when a wafer is transferred from the PM2 to the PM1 by way of the TM); and (3) When a wafer is transferred from the PM1 or PM2 to the LLM1 or the LLM2 by way of the TM.

In the present modification, a threshold that is a permissible range of the position deviation of the wafer can be set at each PM. The threshold can be set at a value of a deviation amount indicating that the temporal change of each PM is beyond the permissible range. Moreover, the threshold in carrying the wafer into each PM and the threshold in carrying the wafer out of each PM can be separately set. The thresholds when carrying the wafer into/out of a PM indicates a limit value of the amount of position deviation where the wafer should not be carried in the next PM. Furthermore, the thresholds when carrying the wafer into/out each PM may indicate the position deviation of the wafer in left and right, vertical and rotational directions. According to the present modification, the thresholds at the time of carry-in/out of the wafer are set for each PM. Thus, by finely controlling the position deviation of the wafer at the time of carry-in/out for each PM, the substrate can be used more safely.

(Determination Process when Detecting Position)

A description is given below of an example of determination process when detecting a position of a wafer according to the modification of the present invention with reference to FIG. 8. The position detection process of the modification is controlled by the control unit 20. Before performing the present process flow, a threshold of a position deviation at carry-in and a threshold of a position deviation at carry-out are preliminarily set for each PM. For example, a threshold of a position deviation in carrying a wafer into the PM1 is set to be a threshold "A", and a threshold of a position deviation in carrying the wafer out of the PM1 is set to be a threshold "B." Similarly, a threshold of a position deviation in carrying a wafer into the PM2 is set to be a threshold "C", and a threshold of a position deviation in carrying the wafer out of the PM2 is set to be a threshold "D."

Figure 7:
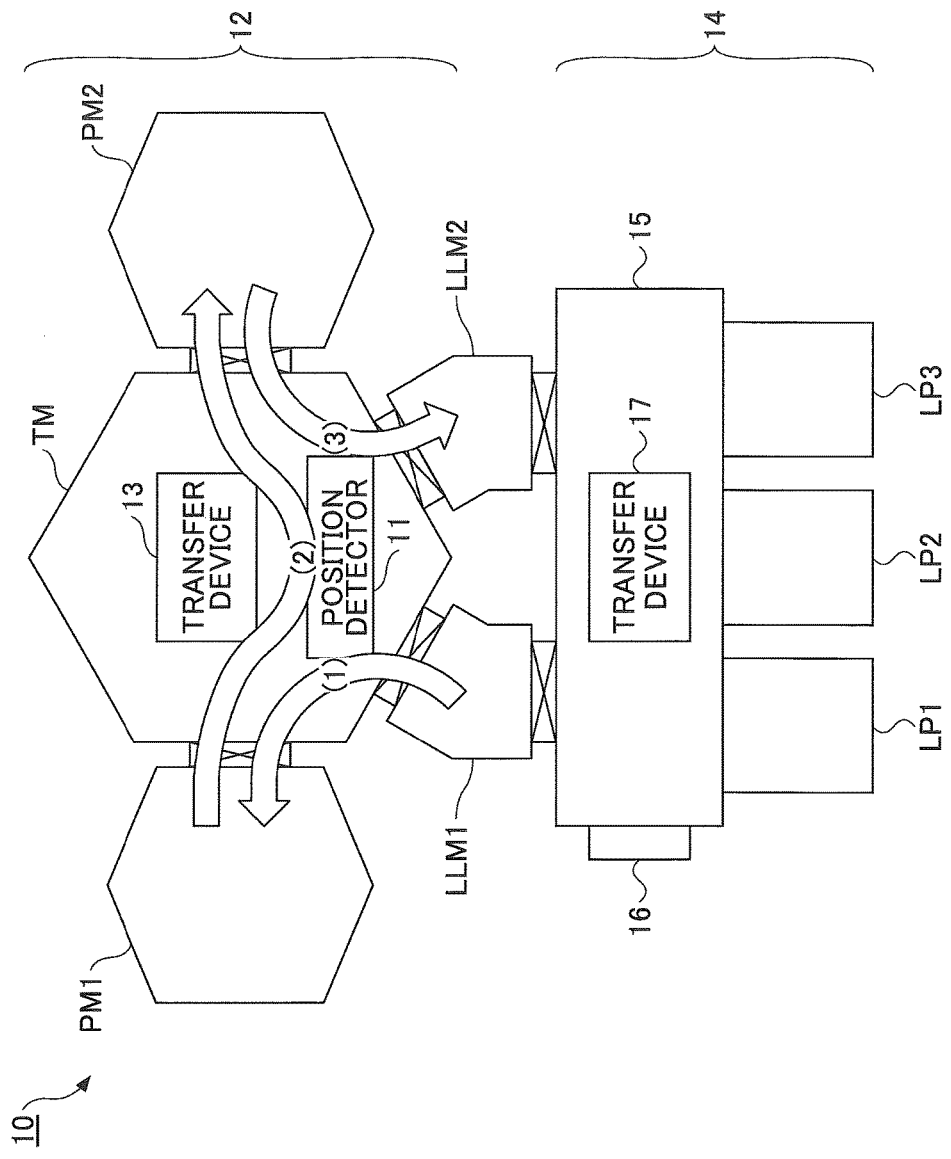
FIG. 7 is a diagram for explaining an example of a relationship between a substrate transfer and a determination process.
Figure 8:
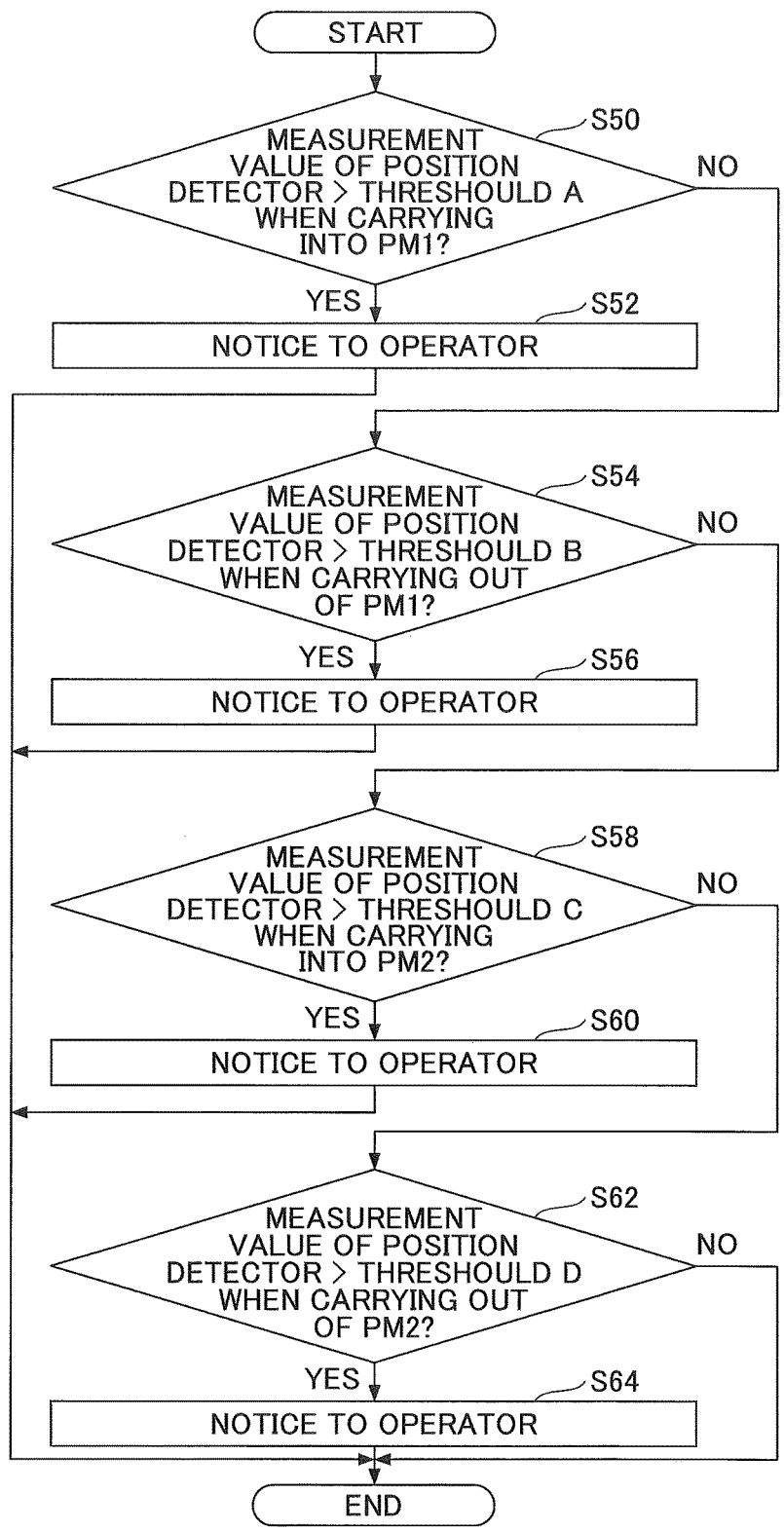
FIG. 8 is a flowchart illustrating an example of a determination process when detecting a position according to an embodiment of the present invention.

When the process in FIG. 8 is started, to begin with, the control unit 20 determines whether a measurement value of a position of a wafer measured by the position detector 11 before carrying the wafer into the PM1 (e.g., see (1) of FIG. 7) is beyond the threshold A that is permissible in carrying the wafer into the PM1 (step S50). When determining that the measurement value of the position of the wafer is beyond the threshold A, the control unit 20 gives notice to an operator (step S52), and finishes the present process flow. On the other hand, when the control unit 20 determines that the measurement value of the position of the wafer is not beyond the threshold A, the process moves to step S54.

Next, the control unit 20 determines whether a measurement value of a position of the wafer measured by the position detector 11 after carrying the wafer out of the PM1 (e.g., see (2) of FIG. 7) is beyond the threshold B that is permissible in carrying the wafer out of the PM1 (step S54). When determining that the measurement value of the position of the wafer is beyond the threshold B, the control unit 20 gives notice to the operator (step S56), and finishes the present process flow. On the other hand, when the control unit 20 determines that the measurement value of the position of the wafer is not beyond the threshold B, the process goes to step S58.

Subsequently, the control unit 20 determines whether a measurement value of a position of a wafer measured by the position detector 11 before carrying the wafer into the PM1 (e.g., see (2) of FIG. 7) is beyond the threshold C that is permissible in carrying the wafer into the PM2 (step S58). When determining that the measurement value of the position of the wafer is beyond the threshold C, the control unit 20 gives notice to the operator (step S60), and finishes the present process flow. On the other hand, when the control unit 20 determines that the measurement value of the position of the wafer is not beyond the threshold C, the process advances to step S62.

Next, the control unit 20 determines whether a measurement value of a position of the wafer measured by the position detector 11 after carrying the wafer out of the PM2 (e.g., see (3) of FIG. 7) is beyond the threshold D that is permissible in carrying the wafer out of the PM1 (step S62). When determining that the measurement value of the position of the wafer is beyond the threshold D, the control unit 20 gives notice to the operator (step S64), and finishes the present process flow. On the other hand, when determining that the measurement value of the position of the wafer is not beyond the threshold D, the control unit 20 finishes the present process flow.

According to the present modification, when the position deviation of the wafer beyond the threshold set at each PM is caused before carrying the wafer into each PM, by giving notice to the operator without carrying the wafer into each PM, the operator can be informed that the position deviation is beyond the permissible range. This can prevent the wafer from being carried in the next PM and being subject to the next process, thereby preventing the wafer from bouncing from the electrostatic chuck and being damaged due to the position deviation. The operator given the notice can visually check a state of the position deviation of the wafer and promptly take measures.

For example, when the notice is given to the operator in carrying the wafer out of the PM1 and an instruction of stopping the process of the wafer is given to the substrate processing apparatus 10 by the operator's determination, the wafer is returned to the LP without carrying the wafer into the PM2. In the present modification, the thresholds A though D do not have to be values indicating conveyance limits, the measures can be finely taken to the position deviation smaller than the conveyance limit. Here, when the position deviation has a risk of causing the wafer to interfere with another component part in a conveyance route in returning the wafer to the LP, other measures may be taken like interlocking the system. Here, the thresholds used in the present modification may be set at the start of operation of the substrate processing apparatus 10.

[Other Configuration of Substrate Processing Apparatus]

The substrate processing apparatus 10 is not limited to the cluster-type substrate processing apparatus 10 illustrated in FIG. 1. For example, the substrate processing apparatus 10 of the embodiment may be a substrate processing apparatus 10 having a configuration illustrated in FIG. 9.

A simple description is given below of the substrate processing apparatus 10 in FIG. 9. The substrate processing apparatus 10 in FIG. 9 includes load lock modules (LLM1 and LLM2) and process modules (PM1 and PM2) attachable to and detachable from a transfer chamber TC. Functions of the TC, the LLM and the PM are similar to the functions of the TM, the LLM and the PM of the above-mentioned embodiment, respectively. The LLM1 includes a transfer arm 19*a*, and the LLM2 includes a transfer arm 19*b*. Also, the TC includes a transfer robot 17. Moreover, the TC includes a pre-aligner 16 to align a direction of the wafer.

Figure 9:
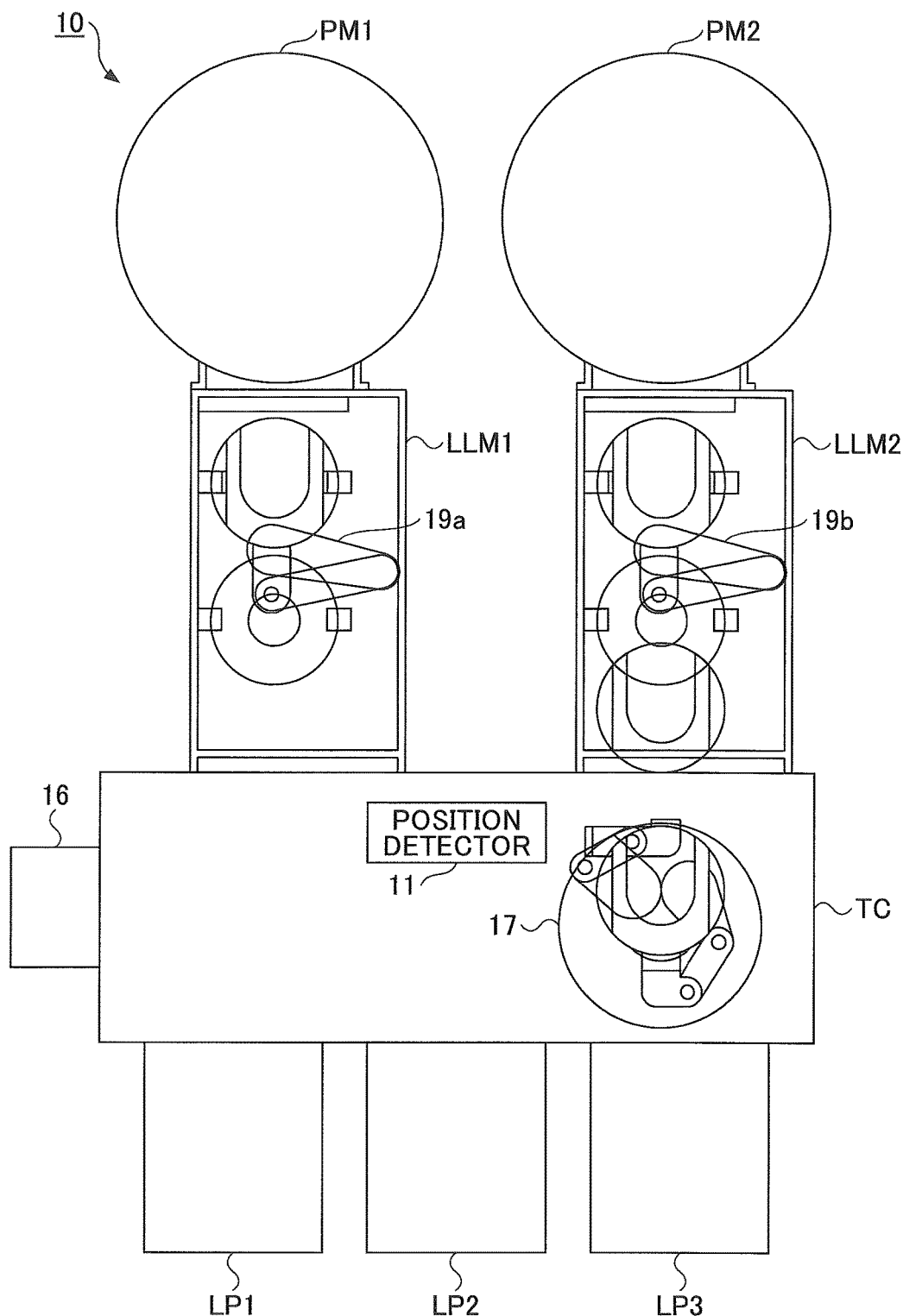
FIG. 9 is a diagram illustrating an example of another configuration of a substrate processing apparatus according to an embodiment of the present invention.

The substrate processing apparatus 10 of FIG. 9 can perform so-called serial conveyance in which, for example, the wafers are successively transferred from any FOUP of the LP1 though LP3 to the plurality of PMs (PM1 and PM2). Moreover, the substrate processing apparatus 10 can perform so-called parallel conveyance in which the wafers are transferred from any FOUP of the LP1 though LP3 to one of the PMs (PM1 and PM2) in parallel with each other. Even in the substrate processing apparatus 10 of FIG. 9, a control unit controls the process and conveyance of the wafer as well as the substrate process apparatus in FIG. 1.

The position of the wafer is sometimes out of alignment in the PM along with the temporal change of the component part in the substrate processing apparatus 10 such as the electrostatic chuck. Therefore, the position detector 11 that can detect presence and absence of the position deviation and the amount of position deviation is provided in the TC. Hereinabove, the position detection processes that have been described are performed by the substrate processing apparatus 10 according to the embodiments and the modifications thereof.

When the position detector 11 performs the position measurement and correction of the position deviation for all of the wafers, even the wafers to be subject to the process that does not have an impact on the component part such as the electrostatic chuck pass through the position detector 11 at the time of carry-in/out of the wafers and are subject to the process such as the position detection at the position detector 11, and the throughput is decreased.

Therefore, according to the substrate processing apparatus, the substrate processing method and the recording medium recording the substrate processing program of the embodiments, the wafers to be processed in accordance with the recipe for the process that has an impact on the component part in the PM such as the electrostatic chuck are automatically selected by the control unit 20 at predetermined intervals. The selected wafers become objects of the position detection performed by the position detector 11. This can prevent the wafers to be excessively transferred to the position detector 11, thereby improving the throughput.

As described above, according to the substrate processing apparatus, the substrate processing method and the recording medium recording the substrate processing program of the embodiments, conveyance of a substrate to a position detector can be suppressed, thereby improving the throughput.

Hereinabove, although the substrate processing apparatus, the substrate processing method and the recording medium recording the substrate processing program have been described according to the embodiments, the substrate processing apparatus, the substrate processing method and the recording medium recording the substrate processing program of the present invention are not limited to the embodiments and various modifications and improvements can be made without departing from the scope of the invention. Moreover, the embodiments and modifications can be combined as long as they are not contradictory to each other.

For example, the PMs included in the substrate processing apparatus of the present invention may be a capacitively coupled plasma (CCP: Capacitively Coupled Plasma) apparatus, an inductively coupled plasma (ICP: Inductively Coupled Plasma) apparatus, a plasma processing apparatus using a radial line slot antenna, a helicon wave excited plasma (HWP: Helicon Wave Plasma) apparatus, an electron cyclotron resonance plasma (ECR: Electron Cyclotron Resonance Plasma) apparatus and the like.

A substrate to be processed in the plasma processing apparatus of the present invention is not limited to the wafer, but for example, may be a large substrate for a flat panel display, a substrate for an EL (electroluminescence) device or a solar cell.

What is claimed is:

1. A substrate processing apparatus comprising:
    at least one process module configured to process first substrates;
    a position detector configured to detect first positions of the first substrates; and
    a control unit configured to control the position detector so as to measure a second position of a second substrate selected from the first substrates to be processed in a same process module depending on a measurement interval set for the same process module,
    wherein the at least one process module includes a plurality of process modules,
    wherein the position detector is configured to further measure position deviation of the second substrate, and
    wherein the control unit is configured to control the position detector so as to measure a position deviation at least in carrying the second substrate into each of the process modules based on a first threshold of the position deviation and carrying the second substrate out of each of the process modules based on a second threshold of the position deviation, the first and second thresholds being set for each of the process modules, and
    wherein the control unit gives notice when the measured position deviation of the second substrate is beyond the first threshold in carrying the second substrate into each of the process modules or the second threshold in carrying the second substrate out of each of the process modules.

2. The substrate processing apparatus as claimed in claim 1,
    wherein the at least one process module is configured to process third substrates in accordance with a procedure set in any of a plurality of recipes, and
    the control unit is configured to control the position detector so as to measure a third position of a fourth substrate selected from the third substrates to be processed in accordance with a predetermined recipe among the first substrates to be processed in the same process module depending on the measurement interval set in the predetermined recipe.

3. A substrate processing apparatus comprising:
    at least one process module configured to process first substrates;
    a position detector configured to detect first positions of the first substrates; and
    a control unit configured to control the position detector so as to measure a second position of a second substrate selected from the first substrates to be processed in a same process module depending on a measurement interval set for the same process module,
    wherein the at least one process module is configured to process third substrates in accordance with a procedure set in any of a plurality of recipes,
    wherein the control unit is configured to control the position detector so as to measure a third position of a fourth substrate selected from the third substrates to be processed in accordance with a predetermined recipe among the first substrates to be processed in the same process module depending on the measurement interval set in the predetermined recipe, and
    wherein the control unit is configured to set the measurement interval of the at least one process module and the measurement interval of the predetermined recipe at valid or invalid, and
    controls the position detector so as to measure the second position of the second substrate and the third position of the fourth substrate selected depending on the measurement interval of the process module and the measurement interval of the predetermined recipe set at valid.

* * * * *